United States Patent [19]

Nomura et al.

[11] Patent Number: 4,735,698

[45] Date of Patent: Apr. 5, 1988

[54] METHOD OF MAKING MAGNETO-OPTICAL RECORDING MEDIUM

[75] Inventors: Masaaki Nomura; Takashi Yamada; Ryoichi Yamamoto; Akira Nahara, all of Odawara, Japan

[73] Assignee: Fuji Photo Film Co., Ltd., Japan

[21] Appl. No.: 33,840

[22] Filed: Apr. 3, 1987

[30] Foreign Application Priority Data

Apr. 11, 1986 [JP] Japan .................................. 61-83717

[51] Int. Cl.$^4$ ........................ B05D 5/12; C23C 16/00; G11B 7/26
[52] U.S. Cl. .................. 204/192.2; 204/192.14; 204/192.22; 204/192.23; 204/192.26; 427/131; 427/251; 427/255.5; 365/122; 369/286; 369/288
[58] Field of Search ............ 204/192.1, 192.2, 192.22, 204/192.23, 192.26, 192.14; 365/122; 360/59; 369/275, 283, 286, 288, 13; 427/251, 255.5, 131

[56] References Cited

U.S. PATENT DOCUMENTS

| | | | |
|---|---|---|---|
| 3,843,420 | 10/1974 | Gittleman et al. | 204/192.2 |
| 4,013,830 | 5/1977 | Pinch et al. | 204/192.2 |
| 4,022,939 | 5/1977 | Roth et al. | 427/251 |
| 4,500,407 | 2/1985 | Boys et al. | 204/192.1 |
| 4,664,977 | 5/1987 | Osato et al. | 428/469 |
| 4,680,742 | 7/1987 | Yamada et al. | 369/13 |

FOREIGN PATENT DOCUMENTS 868514  4/1971  Canada ............................. 204/192.22

*Primary Examiner*—John H. Newsome
*Assistant Examiner*—Marianne L. Padgett
*Attorney, Agent, or Firm*—Gerald J. Ferguson, Jr.; Michael P. Hoffman; Michael J. Foycik, Jr.

[57] ABSTRACT

A method of making a magneto-optical recording medium comprises the steps of moving a rotating substrate along a first dielectric target, at least one rare earth metal target, and a second dielectric target which are disposed in this order from an upstream side toward the downstream side in an in-line sputtering apparatus, and carrying out simultaneous sputtering on the substrate in the course of the movement of the substrate by use of the first dielectric target and the rare earth metal target. Thereafter, sputtering is carried out on the substrate by use of the rare earth metal target. Then, simultaneous sputtering is carried out on the substrate by use of the rare earth metal target and the second dielectric target.

3 Claims, 1 Drawing Sheet

F I G.1
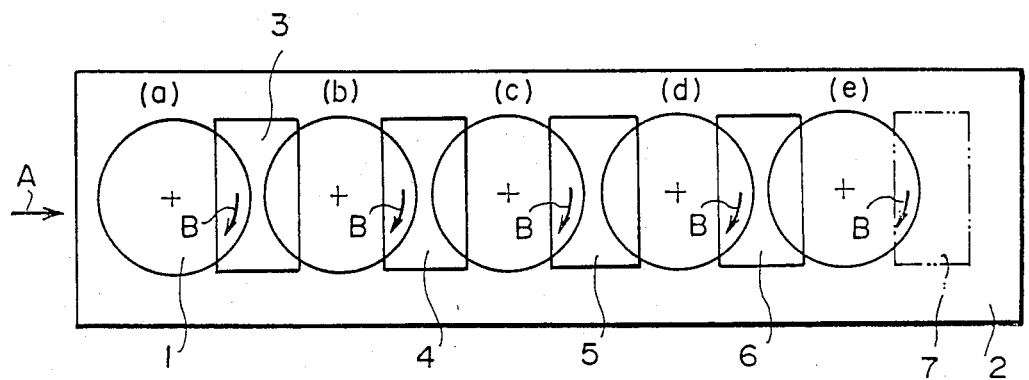
F I G.2
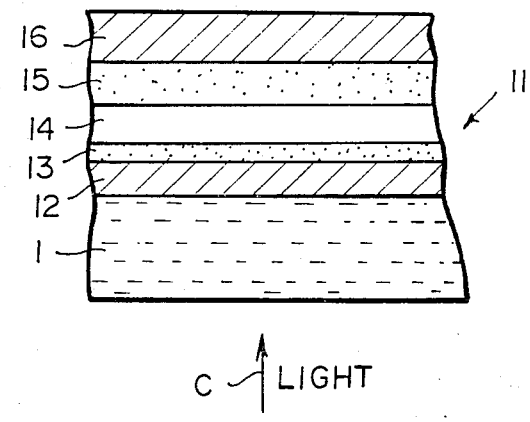

METHOD OF MAKING MAGNETO-OPTICAL RECORDING MEDIUM

BACKGROUND OF THE INVENTION

1. Field of the Invention

This invention relates to a method of making a magneto-optical recording medium such as a magneto-optical disk used for large-capacity data storage or the like. This invention particularly relates to a method of forming thin films such as a recording medium layer and a protective layer by sputtering on a substrate of the magneto-optical recording medium.

2. Description of the Prior Art

Optical recording media have various advantages such that they can record information at a high density, have a large capacity, and need not be contacted with a head. Among such optical media, the magneto-optical recording medium has attracted particular attention for enabling easy erasing and rerecording.

The magneto-optical recording medium is composed of a magnetic material as a recording medium, and records information based on changes in magnetization of the magnetic material. For example, an amorphous magnetic material composed of a combination of a rare earth metal (RE) such as Gd, Tb or Dy with a transition metal such as Fe, Co or Ni is used as the magnetic material. The magnetic material is used in a layer form as a recording layer. The magnetic material, particularly the rare earth metal contained therein, is readily oxidized. When the magnetic material is oxidized, magnetic characteristics such as coercive force thereof deteriorate. Therefore, in order to isolate the recording layer from ambient air, a protective layer formed of a dielectric material or the like is formed on the recording layer by use of a sputtering method or the like.

However, the sputtering process has the drawback that free oxygen given rise to in the course of sputtering for the formation of the protective layer clings to the surface of the recording layer and penetrates through the recording layer, thereby oxidizing the magnetic material. As a result, oxidization is promoted in the course of formation of the protective layer for the purpose of preventing oxidization.

SUMMARY OF THE INVENTION

The primary object of the present invention is to provide a method of making a magneto-optical recording medium which prevents the magnetic material from being oxidized by free oxygen given rise to in the course of formation of a protective layer.

Another object of the present invention is to provide a method of making a magneto-optical recording medium which prevents deterioration of magnetic characteristics.

The present invention provides a method of making a magneto-optical recording medium wherein a rotating transparent substrate is moved from an upstream side to a downstream side in an in-line sputtering apparatus, and a thin film is overlaid by sputtering on said substrate in the course of movement of said substrate, the method of making a magneto-optical recording medium comprising the steps of:

(i) moving said substrate along a first dielectric target, at least one rare earth metal target, and a second dielectric target which are disposed in this order from said upstream side toward said downstream side, (ii) carrying out simultaneous sputtering on said substrate in the course of the movement of said substrate by use of said first dielectric target and said rare earth metal target, (iii) thereafter carrying out sputtering on said substrate by use of said rare earth metal target, and (iv) then carrying out simultaneous sputtering on said substrate by use of said rare earth metal target and said second dielectric target.

By "dielectric target" is meant a target formed of a dielectric material, for example, a compound such as SiO, $SiO_2$, $Si_3N_4$, $Al_2O_3$, AlN, or ZnS.

The term "rare earth metal target" as used herein embraces both a target formed of a rare earth metal alone and a target formed of a compound of a rare earth metal with a transition metal or the like.

In general, with the simultaneous sputtering process, a thin film composed of a plurality of substances in desired composition ratios is formed by disposing a plurality of targets formed of different substances and controlling the sputtering rates of the substances by changing the electric voltage applied to the targets. In the present invention, the term "simultaneous sputtering process" means a sputtering process wherein sputtering (magnetron sputtering or the like) of a rare earth metal and sputtering (radio-frequency sputtering or the like) of a dielectric material are conducted simultaneously on a single substrate.

In the present invention, a first mixture layer is formed of a dielectric material and a rare earth metal by simultaneous sputtering using the first dielectric target and the rare earth metal target, a recording medium layer is formed by sputtering using the rare earth metal target alone, and a second mixture layer is formed of a rare earth metal and a dielectric material by simultaneous sputtering using the rare earth metal target and the second dielectric target. The thicknesses of the mixture layers and the recording medium layer, and the quality of the recording medium layer are determined by various conditions such as the distance between the adjacent targets, the sizes and the number of the targets, the levels of voltage applied to the targets, and the conveyance speed and the rotation speed of the substrate. When the method of the present invention is carried out, it is necessary to adjust the conditions for obtaining a respective layers in desired thicknesses, for example, the first mixture layer having a thickness of 200Å, a recording medium layer having a thickness of 1,000Å, and a second mixture layer having a thickness of 1,000Å.

In a preferred embodiment of the present invention, a first dielectric layer is formed by sputtering using the first dielectric target alone prior to the formation of the first mixture layer, and a second dielectric layer is formed by sputtering using the second dielectric target alone after the formation of the second mixture layer. Therefore, in this case, the first dielectric layer, the first mixture layer, the recording medium layer, the second mixture layer, and the second dielectric layer are overlaid on the substrate in this order.

With the method of making a magneto-optical recording medium in accordance with the present invention, the targets are disposed so that predetermined simultaneous sputtering processes can be effected on the substrate moving in an in-line sputtering apparatus, and it is possible to overlay the first mixture layer, the recording medium layer, and the second mixture layer in this order on the substrate. The magneto-optical recording medium made by the method of the present invention comprises two mixture layers and the recording medium layer interleaved therebetween. Since the mixture layers contain a rare earth metal capable of absorbing free oxygen, free oxygen given rise to in the course of sputtering or the like is absorbed in the mixture layers without penetrating to the recording medium layer, and it becomes possible to prevent the magnetic material in the recording medium layer from being oxidized by free oxygen. Accordingly, with the method of the present invention, it is possible to make a magneto-optical recording medium free from deterioration of coercive force or the like caused by oxidization.

Also, with the method of the present invention, the aforesaid layers can be formed while the substrate is moved from the upstream side to the downstream side in the in-line sputtering apparatus. Therefore, when substrates are sequentially fed at predetermined intervals to the apparatus, it is possible to continuously make desired magneto-optical recording media, to simplify the process of making the magneto-optical recording media, and to reduce the manufacturing cost.

BRIEF DESCRIPTION OF THE DRAWINGS

FIG. 1 is a schematic view showing an embodiment of the method of making a magneto-optical recording medium in accordance with the present invention, and FIG. 2 is a partially cutaway sectional side view showing the layer configuration of the magneto-optical recording medium made by the embodiment of FIG. 1.

DESCRIPTION OF THE PREFERRED EMBODIMENTS

The present invention will hereinbelow be described in further detail with reference to the accompanying drawings.

FIG. 1 schematically shows the relationship between the target layout and a disk-like transparent substrate 1 conveyed in an in-line sputtering apparatus 2. The target array direction coincides with the advancing direction of the substrate 1.

The substrate 1 is fed into the in-line sputtering apparatus 2 in the direction as indicated by the arrow A. The substrate 1 is rotated at an approximately predetermined speed in the direction as indicated by the arrow B by a rotation shaft secured to a conveyance means such as a belt conveyor. When the substrate 1 is conveyed in the direction as indicated by the arrow A up to a position (a), a first dielectric layer is formed by sputtering using a first dielectric target 3. When the substrate 1 is thereafter arrives at a position (b), sputtering with the first dielectric target 3 and sputtering with a first rare earth metal-transition metal target 4 (the rare earth metal-transition metal is hereinafter abbreviated as RE-TM) are carried out, and a first mixture layer consisting of a dielectric material and the RE-TM is overlaid on the substrate 1. Specifically, simultaneous sputtering is carried out at the position (b) by use of the first dielectric target 3 and the first RE-TM target 4. When the substrate 1 is then conveyed up to a position (c), the effect of sputtering with the first dielectric target 3 on the substrate 1 disappears, and a recording medium layer constituted by a RE-TM layer is formed on the substrate 1 by simultaneous sputtering with the first RE-TM target 4 and a second RE-TM target 5. Further, when the substrate 1 arrives at a position (d), a second mixture layer consisting of a dielectric material and the RE-TM is overlaid on the substrate 1 by simultaneous sputtering with the second RE-TM target 5 and a second dielectric target 6. When the substrate 1 thereafter comes to a position (e), the effect of sputtering with the second RE-TM target 5 on the substrate 1 disappears, and a second dielectric layer is formed on the substrate 1 by sputtering with only the second dielectric target 6. A dielectric target 7 of the same type as the second dielectric target 6 may be disposed on the downstream side of the second dielectric target 6 for increasing the thickness of the second dielectric layer.

A thin film is formed on the substrate 1 in the manner as mentioned above. Actually, a plurality of substrates 1, 1, . . . are sequentially fed by the conveyance means into the in-line sputtering apparatus 2, and magneto-optical recording media are continuously made in the same manner as mentioned above. The interval between the preceding substrate 1 and the substrate 1 fed after the preceding substrate 1 may be adjusted to an appropriate value. The feeding interval should preferably be decreased so that, for example, the substrate 1 fed after the preceding substrate 1 comes to the position (a) when the preceding substrate 1 is at the position (b).

The substrate 1 is formed of glass or a transparent plastic material such as an acrylic resin (e.g. PMMA or polycarbonate epoxy resin), to have a thickness of approximately 1 mm.

The dielectric material used for the formation of the dielectric targets 3, 6 and 7 may be SiO, $SiO_2$, $Si_3N_4$, ZnS or the like. Sputtering with the dielectric targets 3, 6 and 7 is ordinarily carried out by the radio-frequency sputtering process.

The RE-TM targets 4 and 5 may be constituted by an alloy such as GdFe, TbFe, DyFe, GdTbFe, TbDyFe, GdFeCo, GdTbCo, TbFeCo, or GdTbFeCo. Sputtering with the RE-TM targets 4 and 5 may be carried out by the magnetron sputtering process.

The in-line sputtering apparatus 2 is evacuated in advance to approximately $10^{-5}$ Torr, and argon gas is introduced thereinto up to a vacuum of approximately $10^{-2}$ Torr.

The rotation speed of the substrate 1 in the direction as indicated by the arrow B should be adjusted by considering the conveyance speed in the direction as indicated by the arrow A and the sputtering rate. Thus the rotation speed and the conveyance speed of the substrate 1 and the sputtering rate should be adjusted so that sputtering is uniformly effected over the whole surface of the substrate 1, and the dielectric material and the RE-TM are approximately uniformly mixed with each other in each of the mixture layers.

Conveyance of the substrate 1 and sputtering thereon may be carried out continuously or intermittently. For example, conveyance of the substrate 1 and sputtering thereon may be carried out at predetermined speeds for a long period. Or, the substrate 1 may be conveyed intermittently to a predetermined position, for example, the position (a), (b) or the like as shown in FIG. 1, sputtering may be activated only when the substrate 1 is disposed at the predetermined position. Also, the manner of conveyance of the substrate 1 and the manner of sputtering may be selected and combined with each other arbitrarily.

FIG. 2 shows the layer configuration of a magneto-optical recording medium 11 made by the embodiment of FIG. 1.

The magneto-optical recording medium 11 comprises a write-side transparent substrate 1, and a first dielectric layer 12, a first mixture layer 13, a recording medium layer 14, a second mixture layer 15, and a second dielectric layer 16 which are overlaid in this order on the substrate 1. An external transparent substrate is then secured to the second dielectric layer 16 by use of an adhesive.

Each of the first dielectric layer 12, the recording medium layer 14, the second mixture layer 15 and the second dielectric layer 16 is formed to a thickness within the range of approximately 500 Å to approximately 3,000 Å. On the other hand, the thickness of the first mixture layer 13 should preferably be adjusted to a value not larger than 200 Å so that characteristics of light incident in the direction as indicated by the arrow C do not markedly change.

The dielectric layers 12 and 16 need not necessarily be overlaid on the substrate 1.

Though a rare earth metal-transition metal is used to constitute the rare earth metal targets 4 and 5 in the aforesaid embodiment, either one of the targets 4 and 5 may be constituted by a rare earth metal alone or by a compound of a rare earth metal with other metal. When the target 4 or the target 5 is constituted by a rare earth metal alone, Gd, Tb, Dy, Ce or the like may be used as the rare earth metal.

The number of targets is not limited to that in the aforesaid embodiment. For example, the number of the RE-TM targets may be increased in order to increase the thickness of the recording medium layer. Or, only a single RE-TM target may be disposed. Also, the sizes of the targets and the intervals therebetween may be adjusted to appropriate values in accordance with the desired thicknesses of the respective layers.

We claim:

1. A method of making a magneto-optical recording medium wherein a rotating transparent substrate is moved from an upstream side to a downstream side in an in-line sputtering apparatus, and a thin film is overlaid by sputtering on said substrate in the course of movement of said substrate, the method of making a magneto-optical recording medium comprising the steps of:
   (i) moving said substrate along a first dielectric target, at least one rare earth metal target, and a second dielectric target which are disposed in this order from said upstream side toward said downstream side,
   (ii) carrying out simultaneous sputtering on said substrate in the course of the movement of said substrate by use of said first dielectric target and said rare earth metal target,
   (iii) thereafter carrying out sputtering on said substrate by use of said rare earth metal target, and
   (iv) then carrying out simultaneous sputtering on said substrate by use of said rare earth metal target and said second dielectric target.

2. A method as defined in claim 1 wherein sputtering is carried out on said substrate by use of only said first dielectric target prior to simultaneous sputtering carried out by use of said first dielectric target and said rare earth metal target, and sputtering is carried out by use of only said second dielectric target after simultaneous sputtering is carried out by use of said rare earth metal target and said second dielectric target.

3. A method as defined in claim 1 wherein conditions of simultaneous sputtering carried out by use of said first dielectric target and said rare earth metal target are adjusted so that the thickness of a thin film formed by said simultaneous sputtering on said substrate is not larger than 200 Å.

* * * * *